Oct. 3, 1950 J. A. WORCESTER, JR 2,524,556

AMPLITUDE LIMITER

Filed Sept. 20, 1946

Inventor:
Joseph A. Worcester Jr.,
by Merton D. Morse
His Attorney.

Patented Oct. 3, 1950

2,524,556

UNITED STATES PATENT OFFICE 2,524,556

AMPLITUDE LIMITER

Joseph A. Worcester, Jr., Fairfield, Conn., assignor to General Electric Company, a corporation of New York Application September 20, 1946, Serial No. 698,373

4 Claims. (Cl. 178—44)

Figure 1:
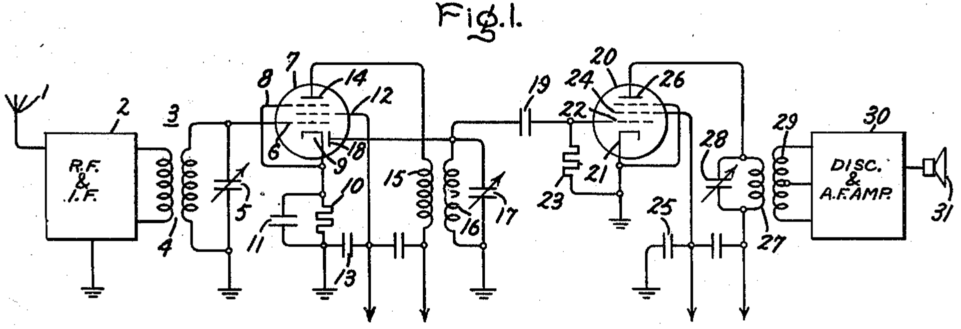

My invention relates to amplifier circuits and, in particular, to amplifier circuits in which the output wave is limited in amplitude. It is a primary object of my invention to provide a new and improved amplitude limiter circuit which is substantially instantaneous in operation.

In radio receivers adapted to receive frequency modulated waves, it is customary to employ a circuit to limit the amplitude of an amplified wave in order that the receivers are responsive only to the rate of change of frequency of a received wave and are not responsive to excessive amplitude variations of that wave. Since amplitude variations above a predetermined value are caused primarily by static or noise impulses, such limiting of the amplitude to values below a predetermined value assists in reducing considerably the magnitude of the noise component in the output of the receiver.

Heretofore, in such amplitude limiter circuits, it has been customary to employ a grid bias type of amplifier circuit and to attempt to obtain a critical value of grid leak resistance which provides an optimum relation of amplitude and width of the current pulses in the anode circuit of the tube. When such an optimum relation is obtained, the value of the fundamental components of the waves supplied to a subsequent discriminator circuit remains substantially constant. However, such a critical balance exists only over a restricted range of amplitude of input signals. It has been necessary, therefore, additionally to restrict the amplitude range of the signals applied to the limiter circuit. Automatic volume control circuits, when employed to provide such a restriction, have the serious disadvantage of a long time constant so that sharp impulse noises are not suppressed effectively. Other circuits have employed two limiter tubes which are balanced so far as time constant is concerned but which have such a low gain that relatively inefficient operation of the tubes results.

Another object of my present invention is to overcome these difficulties by providing a new and improved limiter circuit which is rapid in response to provide better limiting of impulse noises.

It is a still further object of my invention to provide a new and improved limiter circuit in which the anode impedance of a preceding amplifier is changed substantially when the amplitude of the anode current reaches a predetermined value.

It is a still further object of my invention to provide a new and improved limiter circuit which produces a limiting action over a wide range of amplitude of input signals.

One of the features of my invention consists in employing a rectifier across the tuned output circuit of an amplifier, the rectifier being biased so that it is non-conducting below a predetermined value of voltage across the tuned circuit. When this value of voltage is exceeded, the rectifier conducts to change materially the anode impedance of the amplifier and restrict the amplitude range of signals which are supplied to subsequent portions of the receiver circuit. In this manner, the anode impedance of the amplifier is provided with a non-linear characteristic, the impedance being high at low values of anode current and low at high values of anode current. Furthermore, the impedance has a point of sharp discontinuity at a predetermined value of anode current.

Figure 2:
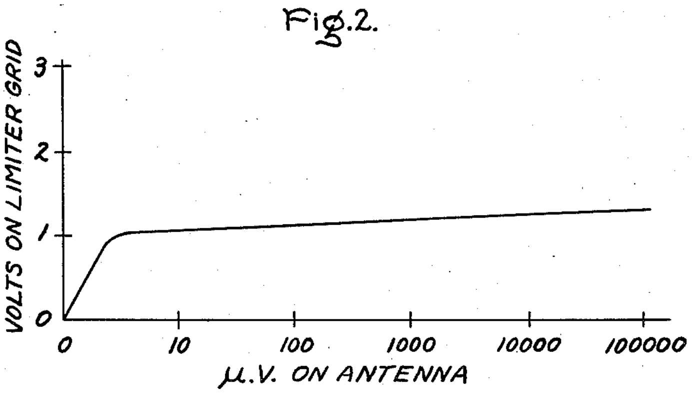
Figure 3:
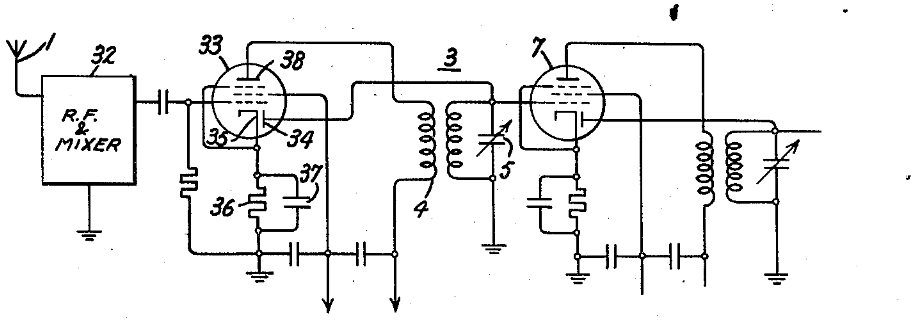

For a better understanding of my invention, reference may be had to the following description taken in connection with the accompanying drawing and its scope will be pointed out in the appended claims. Fig. 1 is a diagrammatic circuit drawing of a radio receiver embodying the invention; Fig. 2 is a graph illustrating certain voltage characteristics of the circuit of Fig. 1; and Fig. 3 is a modification of the receiver circuit of Fig. 1.

In the receiver circuit of Fig. 1, an antenna 1 is connected to high frequency circuits 2 which may include the usual radio frequency amplification and mixing circuits. Circuits 2 likewise include one or more stages of intermediate frequency amplification. The amplified intermediate frequency signals are supplied to a tuned circuit 3 which comprises the transformer 4 and the variable capacitor 5. The signal voltages developed in the tuned circuit are supplied to the control electrode 6 of an electron discharge device 7. The device 7 contains a pentode section in which the suppressor grid 8 may be directly connected to a cathode 9. For purposes to be pointed out later, the cathode 9 is connected to ground through a resistance 10 and a shunt capacitance 11. A screen electrode 12 may be connected to any suitable source of positive potential indicated by the legend + and may be connected to ground by means of by-pass capacitor 13 for alternating currents. The anode 14 of the pentode section of device 7 is connected through a primary winding 15 to a suitable source of operating potential. The winding 15 is coupled to a secondary winding 16 which is shunted by a variable capacitor 17. The reactances 15—17 provide an impedance in the output circuit of the pentode which is tuned to the intermediate frequency waves.

The device 7 likewise contains a diode portion which comprises an anode 18 which is connected to the upper terminal of the winding 16 and capacitor 17. The diode portion of device 7 is illustrated as being contained in the same envelope as the pentode section thereof, and the cathode of the diode portion is illustrated as being physically connected to the cathode 9 of the pentode section, the two cathodes being connected by the same lead wire through the envelope of the combination tube. Obviously, the diode and pentode sections of the device 7 may be contained in separate envelopes as will be readily apparent to those skilled in the art. In this fashion, the cathodes of both the pentode and diode sections of device 7 are connected to ground through the common impedances 10, 11. The upper terminal of the inductance 16 and capacitor 17 is coupled through a capacitor 19 to the input electrode of an electron discharge device 20. The device 20 employs a conventional grid bias type limiter circuit having a cathode 21 which is connected to the control electrode 22 through a grid leak resistance 23. A screen electrode 24 is supplied with operating potentials from any suitable source indicated by the legend + and is connected to ground through a by-pass capacitor 25. The anode 26 of device 20 is connected through a tuned circuit comprising primary winding 27 and variable capacitor 28 to a source of operating potential. The winding 27 is coupled to a winding 29 which may constitute the secondary winding of the transformer of a conventional discriminator. Thus, the winding 29 is shown as connected to a rectangular box marked 30 which may represent conventional discriminator and audio frequency circuits. Audio voltages developed by this discriminator and amplified by the circuit 30 may be supplied to a loudspeaker 31.

In the circuit of Fig 1, for optimum operation, the diode comprising the electrodes 9, 18 has a high permeance or low resistance compared with that of the parallel tuned circuit comprising the inductances 15, 16 and the capacitance 17. In the operation of this circuit, since the diode and pentode sections of the devices 7 have common cathode impedances, the current flowing through the pentode section of the device 7 develops a bias across the resistance 10 which maintains the cathode of the diode section at a positive potential with respect to ground, rendering the diode normally non-conductive. By selection of the value of resistance 10, the bias developed thereacross is sufficient to prevent the diode from conducting until the signal voltage developed across the tuned circuit in the output of the pentode section of device 7 reaches a predetermined value. Preferably, this value of signal voltage, which is supplied to the limiter tube 20, is such that it provides perfect limiting action in the limiter 20. A further increase in the voltage developed across the tuned anode circuit of the pentode causes the diode section of the device 7 to conduct. Such conduction is effective to change the anode impedance of the pentode section from the relatively high impedance of a tuned circuit to the low impedance of the diode. The effect is to provide a non-linear characteristic to the impedance in the anode circuit of the pentode section of device 7. This impedance is high at low values of anode current in that device and may be, for example, of the order of 25,000 ohms. When the voltage developed across that impedance is sufficient to cause conduction in the diode section of the device 7, the value of the impedance in the diode section is reduced, for example, to an impedance of the order of 1,000 ohms. In this fashion, the anode impedance of the pentode has a relatively sharp point of discontinuity at a predetermined value of anode current.

The operation of my circuit may be further explained by reference to the graph of Fig. 2 in which the voltage applied to the grid or control electrode 22 of the limiter 20 is plotted as ordinate against the strength of the signal received by the antenna 1, as abscissa. This graph shows that the voltage supplied to the limiter grid rises rapidly for low level signals at the antenna until conduction in the diode section of device 7 is initiated. Thereafter, the change in input signal strength at the grid of the limiter 20 is very slight for any further increase in strength of received signals. As a result, substantially perfect limiting of the amplitude of the positive pulses of current in the anode circuit of tube 20 is provided.

In the circuit of Fig. 3, I have shown a modification of the receiver circuit illustrated in Fig. 1. In the two figures, like reference numerals have been employed to indicate like elements of the circuits. In this circuit, the antenna 1 supplies signals to radio frequency amplifier and mixer circuits 32 and waves of intermediate frequency are coupled to the control electrode of the pentode section of electron discharge device 33. The device 33 likewise includes a diode section comprising the positive electrode 34 and the cathode 35. The cathode 35 may likewise function as the cathode of the pentode section. The cathode of the two sections is connected to ground through a common resistance 36 and a shunt capacitance 37. The anode 38 of the pentode section is connected through an inductance 4 to a source of operating potential. The inductance 4 forms the primary winding of a transformer which is tuned by means of capacitor 5 to resonate at the intermediate frequency. The remaining portions of the circuit of Fig. 3 are identical with the circuit shown in Fig. 1.

In the circuit of Fig. 3 the connection of the diodes in the intermediate frequency amplifier tubes is similar to that employed in the intermediate frequency amplifier tube 7 of Fig. 1. The operation is essentially the same, the diode functioning to limit the amplitude of the signal voltage supplied to the control electrode of the pentode section of the device 7. The device 7 likewise includes a diode section which further limits the amplitude of the signals supplied to a limit tube so that, despite changes in strength of a repeated signal, the ampltiude of waves supplied to the discriminator circuit remains substantially constant. The limiting action obtained by the circuit of Fig. 3 compares favorably with that obtained by a conventional cascade limiter. At the same time, the full gain properties of each of the intermediate frequency amplifiers may be utilized.

An important advantage of my improved limiter circuit is that it permits full utilization of the gain possibilities of an amplifier tube without impairing the desirable limiting action of the circuit.

Another important advantage is that the diode limiter employed operates without time constant circuits so that instantaneous operation is obtained and effective suppression of short duration impulse noises results.

While my invention has been described by reference to particular embodiments thereof, it will be understood that numerous modifications may be made by those skilled in the art without departing from the invention. I therefore aim in the appended claims to cover all such equivalent variations as come within the true spirit and scope of my invention.

What I claim as new and desire to secure by Letters Patent of the United States is:

1. In an amplitude limiter circuit for frequency modulated wave receivers, an electron discharge device having an anode, a cathode and a control electrode, means for supplying received waves to said control electrode, a resistance connected between said cathode and ground, a transformer having a primary winding connected between said anode and ground and a secondary winding coupled to said primary winding, said secondary winding having a grounded terminal and an output terminal, and a diode having a positive electrode connected to said output terminal and a negative electrode connected to said cathode, said diode being normally rendered non-conductive by current flowing through said resistance and being rendered conductive when the potential of said output terminal exceeds a predetermined value.

2. In an amplitude limiter circuit for frequency modulated wave receivers, an electron discharge device having an anode, a cathode and a control electrode, means for supplying received waves to said control electrode, a resistance connected between said cathode and ground, a transformer having a primary winding connected between said anode and ground and a secondary winding coupled to said primary winding, said secondary winding having a grounded terminal and an output terminal, and a diode having a positive electrode connected to said output terminal and a negative electrode connected to said cathode, said diode being normally rendered non-conductive by current flowing through said resistance and being rendered conductive when the potential of said output terminal exceeds a predetermined value, and said diode having a high permeance whereby when said diode is conducting the impedance connected between said anode and cathode is of low value.

3. An amplitude limiting circuit comprising, an electron discharge device having an anode, a cathode and a control electrode, a resistor connected between said cathode and a point of fixed potential, means for supplying an electrical wave to said control electrode, and means for deriving from said anode said wave in amplified form and for limiting the amplitude thereof to a predetermined maximum value, said last-named means comprising an output circuit connected to said anode and including a tuned circuit, said tuned circuit having a terminal connected to said point of fixed potential and an output terminal, and a rectifier having a positive electrode connected to said output terminal and a negative electrode connected to said cathode, said resistor being of such value that said rectifier is nonconducting when the amplitude of said amplified wave is below said predetermined maximum value.

4. An amplitude limiting circuit comprising, an electron discharge device having an anode, a cathode and a control electrode, a resistor connected between said cathode and ground, means for supplying an electrical wave to said control electrode, and means for deriving from said anode said wave in amplified form and for limiting the amplitude thereof to a predetermined value comprising, an output circuit for said device including a tuned circuit having one terminal thereof connected to ground, and a rectifier having a positive terminal connected to the ungrounded side of said tuned circuit and a negative electrode connected to the ungrounded side of said resistor, said resistor being of such value that said rectifier is nonconducting when the amplitude of said amplified wave is below said predetermined value.

JOSEPH A. WORCESTER, Jr.

REFERENCES CITED

The following references are of record in the file of this patent:

UNITED STATES PATENTS

| Number | Name | Date |
|---|---|---|
| 2,144,015 | Foster | Jan. 17, 1939 |
| 2,207,023 | Pratt | July 9, 1940 |
| 2,224,794 | Montgomery | Dec. 10, 1940 |

FOREIGN PATENTS

| Number | Country | Date |
|---|---|---|
| 553,195 | Great Britain | May 11, 1943 |